United States Patent
Koo et al.

(10) Patent No.: US 7,265,737 B2
(45) Date of Patent: Sep. 4, 2007

(54) FLAT PANEL DISPLAY WITH THIN FILM TRANSISTOR (TFT)

(75) Inventors: Jae-Bon Koo, Yongin (KR); Ji-Yong Park, Suwon (KR); Sang-Il Park, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 678 days.

(21) Appl. No.: 10/725,469

(22) Filed: Dec. 3, 2003

(65) Prior Publication Data

US 2004/0183767 A1 Sep. 23, 2004

(30) Foreign Application Priority Data

Mar. 6, 2003 (KR) .................. 10-2003-0014001

(51) Int. Cl.
*G09G 3/30* (2006.01)
(52) U.S. Cl. ..................... 345/76; 345/87; 345/88
(58) Field of Classification Search ............ 345/76–77, 345/84, 87, 88, 90–92, 204, 214; 257/59, 257/72, 88–93
See application file for complete search history.

(56) References Cited

U.S. PATENT DOCUMENTS

| 5,808,321 | A * | 9/1998 | Mitanaga et al. ............. 257/72 |
| 6,456,013 | B1 | 9/2002 | Komiya et al. .......... 315/169.1 |
| 6,876,001 | B2 * | 4/2005 | Koo et al. ..................... 257/72 |
| 2002/0102821 | A1 | 8/2002 | Voutsas ...................... 438/487 |
| 2003/0025119 | A1 * | 2/2003 | Voutsas et al. ............... 257/88 |
| 2003/0062845 | A1 * | 4/2003 | Yamazaki et al. ....... 315/169.3 |

FOREIGN PATENT DOCUMENTS

| JP | 5-107561 | 4/1993 |
| JP | 9-166788 | 6/1997 |
| JP | 2000-243963 | 9/2000 |
| JP | 2001-109399 | 4/2001 |
| JP | 2001-290441 | 10/2001 |
| WO | WO97/45827 | 12/1997 |

OTHER PUBLICATIONS

European Search Report, dated Jun. 4, 2004.

* cited by examiner

*Primary Examiner*—Richard Hjerpe
*Assistant Examiner*—Mansour M. Said
(74) *Attorney, Agent, or Firm*—H.C. Park & Associates, PLC

(57) ABSTRACT

A flat panel display which can adjust a white balance to a proper level without changing the sizes of driving TFT active layers, even when an identical driving voltage is applied. The flat panel display also can obtain an appropriate luminance and prevent a reduction of its life span by supplying an optimal amount of current to each sub-pixel. The flat panel display includes a plurality of pixels. Each of the pixels includes a plurality of sub-pixels. Each sub-pixel having a self-luminescent element and driving thin film transistors. Each of the driving thin film transistors has a semiconductor active layer with at least a channel region connected to each of the self-luminescent elements to supply current to each of the self-luminescent elements. The channel regions of the semiconductor active layers are arranged in different directions in at least two sub-pixels.

32 Claims, 6 Drawing Sheets

FLAT PANEL DISPLAY WITH THIN FILM TRANSISTOR (TFT)

CROSS-REFERENCE TO RELATED APPLICATION

This application claims the priority of Korean Patent Application No. 2003-14001, filed on Mar. 6, 2003, in the Korean Intellectual Property Office, the disclosure of which is incorporated herein by reference in its entirety.

BACKGROUND OF THE INVENTION

1. Field of the Invention

The present invention relates to an active matrix (AM)-type flat panel display including thin film transistors, and more particularly, to a flat panel display including polycrystalline silicon active layers and thin film transistors arranged in different directions in sub-pixels.

2. Description of the Related Art

Thin film transistors (TFTs) are used as switching units to control the operations of pixels or as driving units to drive pixels in flat panel displays, such as, liquid crystal displays (LCDs) or organic or inorganic electro-luminescent (EL) displays.

A thin film transistor has a semiconductor active layer, a gate insulating layer formed on the semiconductor active layer, and a gate electrode. In the semiconductor active layer, a drain region and a source region are doped with impurities of a high concentration, and a channel region is formed between the drain and source regions. The gate electrode is formed on the gate insulating layer over the channel region of the semiconductor active layer. The semiconductor active layer can be either an amorphous silicon layer or a polycrystalline silicon layer.

Thin film transistors using amorphous silicon can be deposited at a low temperature, but have degraded electrical characteristics and low reliability, and as such, are generally not suitable for large-sized display devices. Hence, polycrystalline silicon thin film transistors are being used. Polycrystalline silicon has a high mobility of several tens through several hundreds of $cm^2/V.s$, a low high-frequency operating characteristic, and a low current leakage value. Thus, the polycrystalline silicon is very suitable for use in large, high-definition flat panel displays.

As described above, thin film transistors are used, for example, as switching units and/or pixel driving units in flat panel displays. An AM-type organic EL display includes at least two thin film transistors (hereinafter, referred to as TFTs) for each sub-pixel.

An organic EL element has an organic luminescent layer between an anode and a cathode. In the organic EL element, as an anode voltage and a cathode voltage are applied to the anode and the cathode, respectively, holes introduced from the anode are transported to the luminescent layer via a hole transport layer, and electrons introduced from the cathode are transported to the luminescent layer via an electron transport layer. In the luminescent layer, the electrons and the holes are combined to produce exitons. As the excited state of the exitons is changed to a ground state, fluorescent molecules on the luminescent layer emit light to form an image. Generally, in full-color organic EL displays, pixels emitting three colors, namely, red (R), green (G), and blue (B), are included as an organic EL element to achieve a full-color display.

However, in such organic EL displays, R, G, and B luminescent layers emitting R, G, and B light, respectively, have different luminescent efficiency (cd/A) for colors. Since the luminescence of the luminescent layers is approximately proportional to a current value applied to each sub-pixel, for the same current applied to sub-pixels, some colors have low luminescence and some colors have high luminescence. Accordingly, achieving a proper color balance or white balance can be difficult. For example, if the luminescent efficiency of the G luminescent layer is 3 to 6 times higher than those of the R and B luminescent layers, a current 3 to 6 times greater than a current for the G luminescent layer should be applied to the R and B luminescent layers in order to adjust the white balance to a proper level.

A conventional method of adjusting the white balance to a proper level as described above is disclosed in Japanese Patent Publication No. 5-107561, wherein different voltages supplied through a driving line, that is, different Vdd values, are applied to different pixels.

Japanese Patent Publication No. 2001-109399 discloses a method of adjusting a white balance by controlling the size of a driving TFT. More specifically, driving TFTs with different ratios of width W to length L of a channel region are applied to R, G, and B pixels to thereby control the amount of current flowing into each of the R, G, and B organic EL elements.

Japanese Patent Publication No. 2001-290441 discloses a method of adjusting a white balance by forming different sized pixels for the different colors. In this method, a green luminescent region with the highest luminescent efficiency has the smallest luminescent area compared to the red and blue luminescent regions. Thus a proper white balance and a display device with a long life span may be obtained. A different luminescent area can be obtained by varying the anode area.

A method of adjusting luminescence by controlling the amount of current by applying different voltage ranges to R, G, and B color pixels via a data line is also known as a conventional method of adjusting a white balance.

However, none of the methods discussed above consider the crystal structure of a polycrystalline silicon TFT of a flat panel display. In other words, if the direction of arrangement of TFT active layers and the crystal direction of polycrystalline silicon are considered, the mobility may vary according to these directions. In this case, the white balance cannot be adjusted using the above-described methods.

If the amount of current flowing into an organic EL element in each sub-pixel exceeds a limit value, luminescence per unit area is greatly increased by the amount of current greater than the limit value. Accordingly, the life span of the organic EL elements rapidly decreases. Thus, to increase the life span of organic EL elements, an optimal amount of current should to be supplied to each sub-pixel.

SUMMARY OF THE INVENTION

The invention provides a flat panel display which can adjust a white balance to a proper level without changing the sizes of driving TFT active layers, even when an identical driving voltage is applied.

The invention separately provides a flat panel display which obtains an appropriate luminance and prevents a reduction of its life span by supplying an optimal amount of current to each sub-pixel.

According to an aspect of the invention, there is separately provided a flat panel display including a plurality of pixels. Each of the pixels includes a plurality of sub-pixels and each sub-pixel has a self-luminescent element, a driving thin film transistor and a semiconductor active layer. The semiconductor active layer has a channel region electrically connected to each of the self-luminescent elements to supply current to each of the self-luminescent elements through the source or drain regions. The channel regions of the semiconductor active layers are arranged in different directions in at least two sub-pixels.

In various embodiments of the invention, the sub-pixels can have different colors.

In various embodiments of the invention the channel regions in the sub-pixels of different colors can be installed in different directions.

In various embodiments of the invention the different directions of the channel regions can be determined by amounts of current flowing in the self-luminescent elements of the sub-pixels of different colors when an identical driving voltage is applied to the sub-pixels of different colors.

In various embodiments of the invention the different directions of the channel regions can be determined by different mobility values of the channel regions of the driving thin film transistors of the sub-pixels of different colors.

In various embodiments of the invention the semiconductor active layers can be formed of polycrystalline silicon.

In various embodiments of the invention the polycrystalline silicon may have anisotropic grains.

In various embodiments of the invention the different directions of the channel regions can be determined by directions of grain boundaries of the polycrystalline silicon of the channel regions.

In various embodiments of the invention the different directions of the channel regions can be determined so that angles made by the direction of current flow in the channel regions of the sub-pixels of different colors and the grain boundaries of the polycrystalline silicon of the channel regions are proportional to the values of current flowing in the sub-pixels of different colors when an identical driving voltage is applied to the sub-pixels of different colors.

In various embodiments of the invention the different directions of the channel regions can be determined so that the angles made by the direction of the current flow in the channel regions of the sub-pixels of different colors and the grain boundaries of the polycrystalline silicon of the channel regions are proportional to the mobility values of the channel regions.

In various embodiments of the invention the polycrystalline silicon can be formed using a solidification method using laser.

According to another aspect of the invention, there is provided a flat panel display including a plurality of pixels. Each of the pixels includes sub-pixels of red, green, and blue colors and each sub-pixel has a self-luminescent element and a driving thin film transistor. Each sub-pixel also has a semiconductor active layer with a channel region is connected to each of the self-luminescent elements to supply current to each of the self-luminescent elements. The channel regions of the semiconductor active layers in the sub-pixels of different colors are arranged in different directions.

In various embodiments of the invention, the different directions of the channel regions can be determined by values of current flowing in the self-luminescent elements of the sub-pixels of different colors when an identical driving voltage is applied to the sub-pixels of different colors.

In various embodiments of the invention, the different directions of the channel regions can be determined so that a current of a smallest value flows in the self-luminescent elements of the green sub-pixels.

In various embodiments of the invention, the different directions of the channel regions can be determined so that the amount of current in the self-luminescent elements of the red sub-pixels is greater than the amount of current in the self-luminescent element of the green sub-pixels.

In various embodiments of the invention, the different directions of the channel regions can be determined by mobility values of the channel regions of the driving thin film transistors of the sub-pixels of different colors.

In various embodiments of the invention, the different directions of the channel regions can be determined so that the channel region of the semiconductor active layer of the self-luminescent element of a green sub-pixel has the smallest mobility value.

In various embodiments of the invention, the different directions of the channel regions can be determined so that the mobility values of the channel regions of the driving thin film transistors decrease in the sequence of red, blue, and then green sub-pixels.

In various embodiments of the invention, the semiconductor active layers can be formed of polycrystalline silicon.

In various embodiments of the invention, the polycrystalline silicon may have anisotropic grains.

In various embodiments of the invention, the different directions of the channel regions can be determined by the directions of grain boundaries of the polycrystalline silicon of the channel regions.

In various embodiments of the invention, the different directions of the channel regions can be determined so that an angle made by the current-flowing direction at the channel region of a green sub-pixel and a grain boundary of the polycrystalline silicon of the channel region of the green sub-pixel is greater than the angles made by the direction of current flow in the channel regions of the red and/or blue sub-pixels with grain boundaries of the polycrystalline silicon of the channel regions of the red and blue sub-pixels.

In various embodiments of the invention, the different directions of the channel regions can be determined so that an angle made by the direction of current flow in the channel region of a red sub-pixel and a grain boundary of the polycrystalline silicon of the channel region of the red sub-pixel is smaller than the angles made by the current-flowing direction at the channel regions of the green and/or blue sub-pixels with grain boundaries of the polycrystalline silicon of the channel regions of the green and blue sub-pixels.

In various embodiments of the invention, the different directions of the channel regions can be determined so that an angle made by the direction of current flow in the channel region of a sub-pixel and a grain boundary of the polycrystalline silicon of the channel region of the driving thin film transistor of the sub-pixel decreases in sequence of green, blue, and/or then red sub-pixels.

In various embodiments of the invention, the polycrystalline silicon can have primary grain boundaries parallel to one another and side grain boundaries of anisotropic grains each approximately perpendicular to the primary grain boundaries and located between adjacent primary grain boundaries.

In various embodiments of the invention, the different directions of the channel regions can be determined with respect to the direction of the primary grain boundaries of the polycrystalline silicon of the channel regions.

In various embodiments of the invention, the different directions of the channel regions can be determined so that an angle made by the direction of current flow in the channel region of a green sub-pixel and a primary grain boundary of the polycrystalline silicon of the channel region of the green sub-pixel is smaller than angles made by the direction of current flow in the channel regions of the red and blue sub-pixels with the primary grain boundaries of the polycrystalline silicon of the channel regions of the red and blue sub-pixels.

In various embodiments of the invention, the different directions of the channel regions can be determined so that an angle made by the direction of current flow in the channel region of a red sub-pixel and a primary grain boundary of the polycrystalline silicon of the channel region of the red sub-pixel is greater than angles made by the direction of current flow in the channel regions of the green and blue sub-pixels with grain boundaries of the polycrystalline silicon of the channel regions of the green and blue sub-pixels.

In various embodiments of the invention, the different directions of the channel regions can be determined so that an angle made by the direction of current flow in the channel region of a sub-pixel and a primary grain boundary of the polycrystalline silicon of the channel region of the sub-pixel increases in sequence of green, blue, and then red sub-pixels.

In various embodiments of the invention, the direction of current flow in the channel region of each of the green sub-pixels can be parallel to a primary grain boundary of the polycrystalline silicon of the channel region.

In various embodiments of the invention, the direction of current flow in the channel region of each of the red sub-pixels can be perpendicular to a primary grain boundary of the polycrystalline silicon of the channel region.

In various embodiments of the invention, the polycrystalline silicon can be formed using a solidification method using laser.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
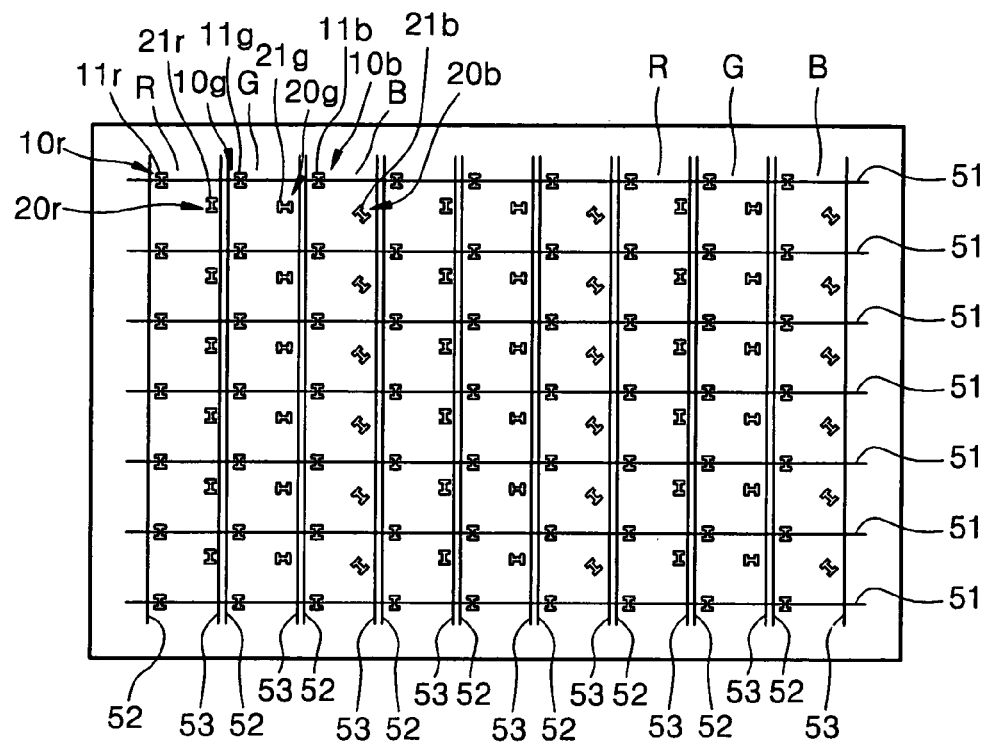
FIG. 1 is a plan view of a structure of a TFT active layer of an AM-type organic EL display according to an exemplary embodiment of the invention.

FIG. 1 is a plan view of a structure of a TFT active layer of an AM-type organic EL display according to an exemplary embodiment of the present invention. Referring to FIG. 1, the organic EL display includes a plurality of pixels, each of which is formed by repetitively arranging of a group of R, G, and B sub-pixels in a vertical direction. However, the present invention is not limited to the above sub-pixel arrangement. For example, sub-pixels of different colors can be arranged in various patterns, such as, a mosaic pattern or a lattice pattern to form a pixel.

In the organic EL display of FIG. 1, a plurality of gate lines 51 are arranged horizontally, and a plurality of data lines 52 are arranged vertically. Driving lines 53 for supplying power are also arranged vertically. One sub-pixel is defined by one gate line 51, one data line 52, and one driving line 53.

Each of the sub-pixels includes at least two TFTs, that is, a first TFT and a second TFT. First TFTs 10$r$, 10$g$, and 10$b$ can be switching TFTs for controlling the operations of organic EL elements using a signal via a gate line 51, and second TFTs 20$r$, 20$g$, and 20$b$ can be driving TFTs for driving the organic EL elements. Of course, the number of TFTs and the arrangement of the TFTs can vary depending on the characteristics of a display, the type of a driving method, or the like.

The first TFTs 10$r$, 10$g$, and 10$b$ have first semiconductor active layers 11$r$, 11$g$, and 11$b$, respectively, and the second TFTs 20$r$, 20$g$, and 20$b$ have second semiconductor active layers 21$r$, 21$g$, and 21$b$, respectively. Each of these semiconductor active layers has a channel region (not shown), which will be described later. The channel region of each of the first TFTs and second TFTs is located substantially at the center of each of the first semiconductor active layers 11$r$, 11$g$, and 11$b$, and the second semiconductor active layers 21$r$, 21$g$, and 21$b$, and is formed under a gate electrode while being insulated from the gate electrode.

As can be seen from FIG. 1, the second semiconductor active layers 21$r$, 21$g$, and 21$b$, which constitute a driving TFT, can be arranged in different directions in different sub-pixels.

More specifically, the second semiconductor layers 21$r$, 21$g$, and 21$b$ can be arranged in different directions for different colors. In other words, the second semiconductor active layers 21$r$, which constitute a red pixel (R), the second semiconductor active layers 21$g$, which constitute a green pixel (G), and the second semiconductor active layers 21$b$, which constitute a blue pixel (B), are arranged in different directions for pixels of different colors. If the R, G, and B sub-pixels are arranged in a mosaic pattern instead of strips as shown in FIG. 1, the second semiconductor active layers are arranged in different directions while keeping the mosaic pattern. If the sub-pixels have colors other than red, green, and blue, the second semiconductor active layers are still arranged in different directions for different colors.

The first semiconductor active layers 11$r$, 11$g$, and 11$b$ and the second semiconductor active layers 21$r$, 21$g$, and 21$b$ may be formed, for example, of a thin layer of polycrystalline silicon. As described above, the second semiconductor active layers 21$r$, 21$g$, and 21$b$ are arranged in different directions for R, G, and B sub-pixels. To be more specific, it is the channel regions at the centers of the second semiconductor active layers 21$r$, 21$g$, and 21$b$ that can have different directions. However, FIG. 1 shows the arrangement of the second semiconductor active layers in their entirety in different directions to avoid complicating the drawing unnecessarily. Hence, the arrangement directions of TFT active layers will replace the arrangement directions of channel regions of the TFT active layers, as it is the channel regions of TFT active layers, not the TFT active layers in their entirety, which can be arranged in different directions. This fact will refer equally to all embodiments to be described later.

According to the invention, as the channel regions of the second semiconductor active layers of the second TFTs, which are used as driving TFTs, have different directions for R, G, and B sub-pixels, the semiconductor active layers can have the same size, and a white balance can be obtained even when the same driving voltage is applied to the R, G, and B sub-pixels. This principle will be described below in greater detail.

As described above, in organic EL displays, the luminescent layers of the R, G, and B pixels each have different luminescent efficiency and accordingly, provide different luminescence values. Hence, a white balance is not obtained when an identical current is applied to all three luminescent layers. Table 1 shows the luminescent efficiency of the R, G, and B organic luminescent layers, which are widely used in current organic EL displays, as well as the and current values to be applied to each of R, G, and B sub-pixels to obtain a white balance.

TABLE 1

|  | Red | Green | Blue |
| --- | --- | --- | --- |
| Efficiency (Cd/A) | 6.72 | 23.37 | 4.21 |
| Pixel current (μA) | 0.276 | 0.079 | 0.230 |
| Pixel current ratio | 3.5 | 1 | 2.9 |

As can be seen from Table 1, to achieve a white balance, the smallest amount of current is applied to green sub-pixels, followed by the current amount for blue sub-pixels. The greatest amount of current is applied to red sub-pixels.

The difference in current amount can be obtained by differentiating the arrangement direction of the semiconductor active layers 21r, 21g, and 21b of the second TFTs 20r, 20g, and 20b, which are driving TFTs for supplying current to luminescent elements. In other words, due to the arrangement of the active layers 21r, 21g, and 21b of the second TFTs 20r, 20g, and 20b in different directions, different amounts of current are applied to the luminescent elements (for example, organic EL elements) of the R, G, and B sub-pixels having the second TFTs 20r, 20g, and 20b.

In other words, the directions of the active layers 21r, 21g, and 21b of the second TFTs 20r, 20g, and 20b are determined by the amount of current flowing in the organic EL elements of the sub-pixels at an identical driving voltage. Hence, to obtain a white balance, the active layers 21g of each of the second TFTs 20g in green sub-pixels are arranged in a direction that enables a current of the lowest amount, for example, to be applied to the organic EL elements of the green sub-pixels which have the greatest luminance. Generally, the directions of the active layers 21r, 21g, and 21b of each of the second TFTs 20r, 20g, and 20b are controlled so that the current amount applied to each of the organic EL elements of the sub-pixels is the largest for R sub-pixels and the smallest for G sub-pixels. As such, the arrangement direction of the active layer 21b of each of the second TFTs 20b, for the B sub-pixels, is controlled such that the current amount applied to each of the organic EL elements is between the current amount for the R sub-pixels and the current amount for the G sub-pixels. In other words, the directions of the second active layers 21r are determined so that a current of the greatest amount can be applied to the organic EL elements of red sub-pixels, and the directions of the second active layers 21b are determined so that a current of an amount between the greatest and smallest amount can be applied to the organic EL elements of the blue sub-pixels, the directions of the second active layers 21g are determined so that a current of the smallest amount can be applied to the organic EL elements of green sub-pixels. Accordingly, the luminance of each of the R, G, and B sub-pixels is compensated for so that the white balance can be adjusted to a proper level.

The directions of the active layers 21r, 21g, and 21b of the second TFTs 20r, 20g, and 20b can also be determined according to the mobility of the channel regions of each of the active layers. This is because a large current can flow in the channel region when a channel region has a high mobility, and a small current can flow in the channel region when a channel region has a low mobility.

Hence, to obtain a white balance, the active layer 21g of each of the second TFTs 20g in green sub-pixels is arranged in a direction that enables the green sub-pixels with the greatest luminance to have the lowest mobility. Generally, the directions of the active layers 21r, 21g, and 21b of each of the second TFTs 20r, 20g, and 20b are controlled so that the mobility of a channel region of an active layer of a second TFT is greatest for the R sub-pixels, is the smallest for G sub-pixels and the mobility of the channel of each B sub-pixel is smaller than the mobility of the channel of the R sub-pixel but larger than the mobility of the channel of the G sub-pixel. In other words, the directions of the second active layers 21r are determined so that their channel regions can have the greatest mobility, and the directions of the second active layers 21g are determined so that their channel regions can have the smallest mobility, the directions of the second active layers 21b are determined so that their channel regions can have a mobility between the mobility of the channel of the R sub-pixels and the channel of the G sub-pixels. Accordingly, currents of different values flow in the organic EL elements of the R, G, and B sub-pixels as described above, and the luminance of each of the R, G, and B sub-pixels is compensated for. Thus, the white balance can be adjusted to a proper level.

The difference in current value and the difference in mobility can vary according to the crystal structure of polycrystalline silicon of which the active layers are formed. In other words, different current values and different mobilities for the R, G, and B sub-pixels can be obtained by differentiating the directions of the active layers in the R, G, and B sub-pixels according to the crystal structure of polycrystalline silicon. This will now be described below in greater detail.

Figure 2:
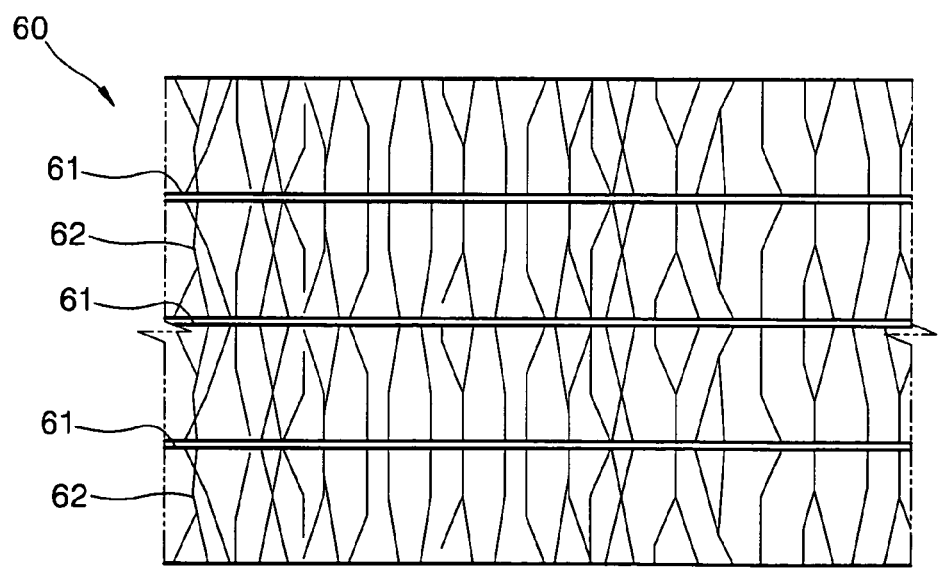
FIG. 2 is a plan view of an anisotropic crystal structure of a polycrystalline silicon thin film that forms a TFT active layer.

FIG. 2 is a plan view of the anisotropic crystal structure of a polycrystalline silicon thin film that forms a TFT active layer. A polycrystalline silicon thin film with an anisotropic crystal structure as shown in FIG. 2 is obtained by solidifying an amorphous silicon thin film using a well-known sequential lateral solidification method (hereinafter, referred to as an SLS method). It should be understood by one of ordinary skill in the art that such an anisotropic crystal structure is not limited to the crystal structure formed by the SLS method but can be formed in any solidification method that enables a polycrystalline silicon thin film to have an anisotropic crystal structure e.g., MILC (Metal Induced Lateral Crystalization). Generally, a solidification method using a laser is used.

The SLS method is based on the fact that silicon grains grow on the boundary between a liquid portion of silicon and a solid portion of silicon in a direction perpendicular to the boundary surface. In the SLS method, amorphous silicon is partially melted by projecting a laser beam onto a mask that covers the amorphous silicon. The silicon grows from the boundary between the melted silicon portion and the unmelted silicon portion and is then solidified.

As can be seen from FIG. 2, a crystal structure formed by the SLS method comprises a plurality of primary grain boundaries 61, which are isolated from one another at predetermined intervals, and a plurality of side grain boundaries of anistropic grains 62, which exist between adjacent primary grain boundaries 61 and extend in a direction approximately perpendicular to the primary grain boundaries 61. The side grain boundaries 62 are arranged more densely than the primary grain boundaries 61. Each of the side grain boundaries 62 melts by light passed through a mask and grows. Accordingly, a silicon thin film 60 has the side grain boundaries 62 formed longitudinally between the primary grain boundaries 61.

Because the silicon thin film 60 having the primary and side grain boundaries 61 and 62 has such an anisotropic crystal structure, a TFT can have an anisotropic structure depending on the direction of a channel region of an active layer to be formed like the silicon thin film 60. In other words, the mobility and current value of a channel region in the silicon thin film 60 having an anisotropic crystal structure vary according to a direction in which the channel region is formed.

Figure 3:
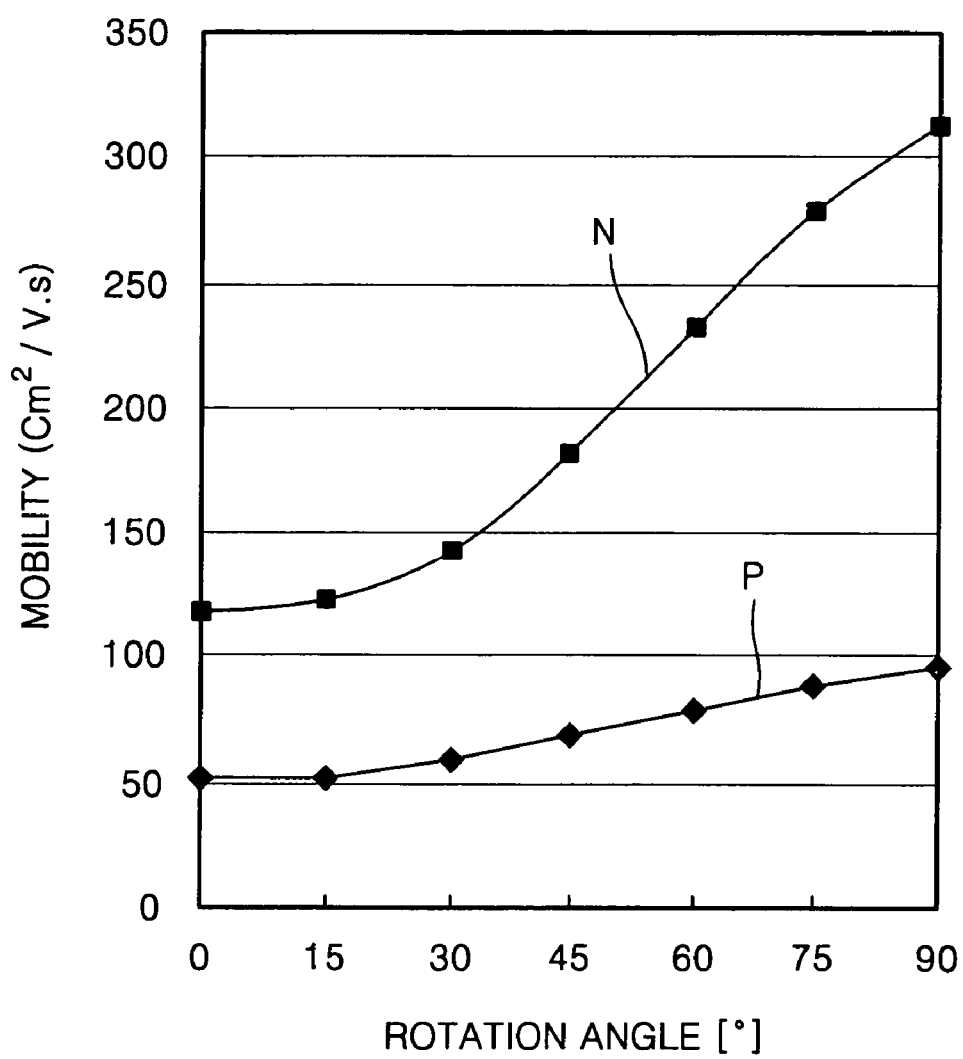
FIG. 3 is a graph showing a relationship between a direction of an active layer and a mobility of a channel region.
Figure 4:
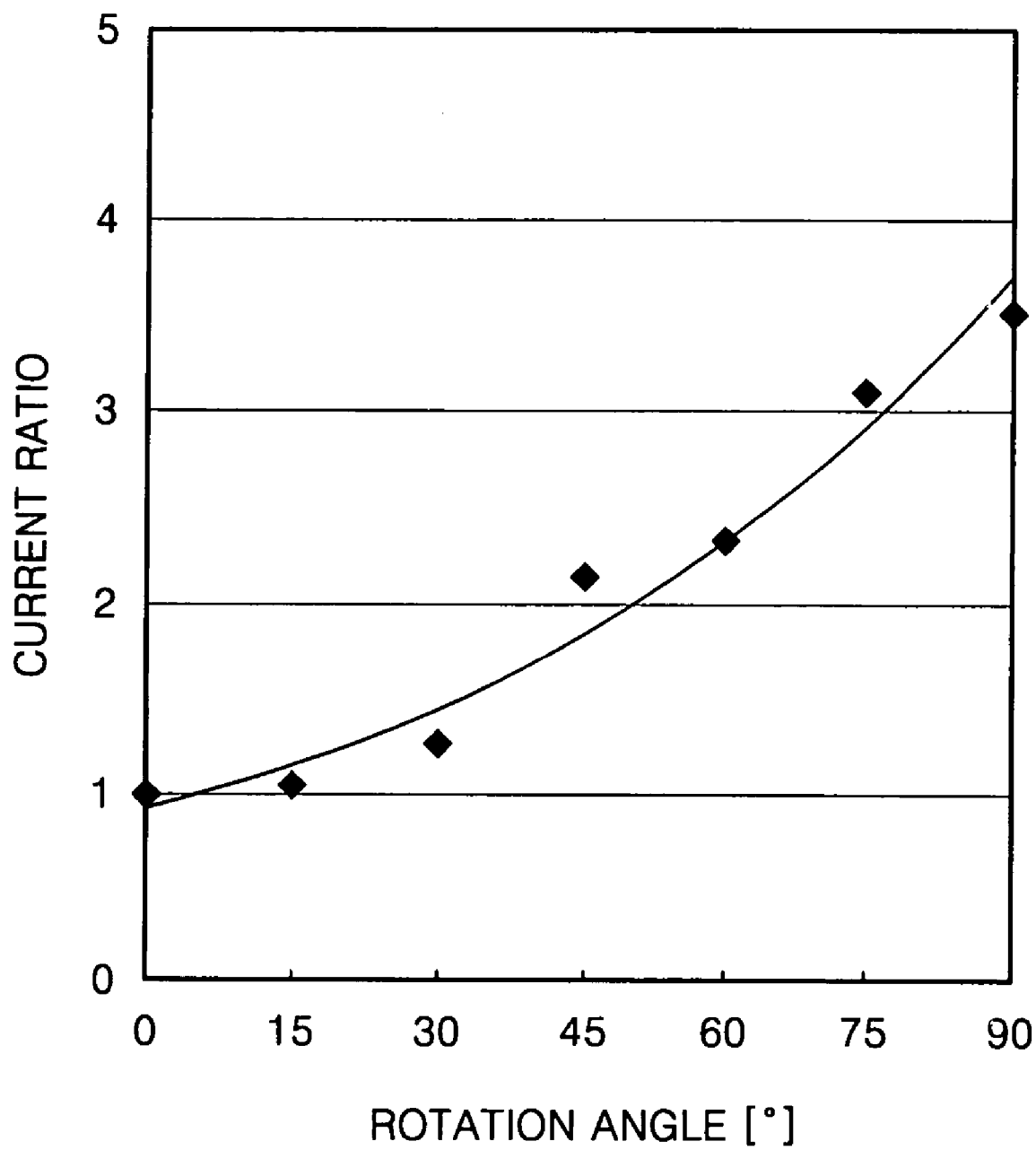
FIG. 4 is a graph showing a relationship between a direction of an active layer and a current ratio.

FIGS. 3 and 4 show the mobility and current ratio, respectively, of a channel region of an active layer versus an angle formed by the primary grain boundaries 61 and the direction of current flow in the channel region of the active layer. In FIGS. 3 and 4, a rotation angle denotes an angle formed by the direction of current flow in a channel region of an active layer and the primary grain boundaries 61, which are approximately perpendicular to the side grain boundaries 62.

In FIG. 3, P denotes the mobility of a TFT measured from source and drain regions to which P-type impurities are added, and N denotes the mobility of a TFT measured from source and drain regions to which N-type impurities are added. As can be seen from FIG. 3, the mobility of the channel region of a TFT increases as the angle formed by the current-flowing direction at the channel region and each of the primary grain boundaries 61 increases. Accordingly, the mobility increases as the rotation angle increases from 0 degrees to 90 degrees.

This phenomenon can be interpreted as an effect of the resisting properties on the motion of carriers. If the direction of current-flow in the channel region of an active layer is parallel (i.e. 0 degrees) with the primary grain boundaries 61, that is, if the direction of current-flow at the channel region is approximately perpendicular to the side grain boundaries 62, carriers move in a direction perpendicular to the side grain boundaries 62, and accordingly, a resistance against the motion of carrier is large. Hence, the channel region has a low mobility. If the current-flowing direction at the channel region of an active layer makes 90 degrees with the primary grain boundaries 61, that is, if the direction of current-flow in the channel region is approximately parallel to the side grain boundaries 62, carriers move in a direction parallel to the side grain boundaries 62, and accordingly, the resistance against the motion of carrier is small. Hence, the channel region has a high mobility.

As shown in FIG. 4, the difference in mobility between the aforementioned two cases can be represented as a difference in current ratio. It can be seen from FIG. 4 that as the angle formed by the direction of current-flow in the channel region of an active layer and the primary grain boundaries 61 increases, a current ratio increases. Referring to FIG. 4, when the direction of current-flow in the channel region of an active layer makes 90 degrees with the primary grain boundaries 61, that is, when the direction of current-flow in the channel region is approximately parallel to the side grain boundaries 62, a current value is at least 3.5 times greater than when the direction of current-flow in the channel region makes 0 degrees with the primary grain boundaries 61. Hence, the channel region of a driving TFT in red sub-pixels, which generally needs the current with the greatest value, is designed such as to make, for example, 90 degrees with the primary grain boundaries 61. The channel region of a driving TFT in green sub-pixels, which generally needs the current with the smallest value, is designed such as to make, for example, 0 degrees with the primary grain boundaries 61. By doing this, even when active layers are substantially identical in size, and a substantially identical driving voltage is applied to all sub-pixels, a white balance can be achieved. In this case, the channel region of a driving TFT in blue sub-pixels can be rotated to make a certain angle in the range of 0 to 90 degrees with the primary grain boundaries 61. In EL elements having the data shown in Table 1, the channel region of a driving TFT in blue sub-pixels can be designed such as to make a certain angle in the range of about 70 to 75 degrees, for example, with the primary grain boundaries 61.

Figure 5:
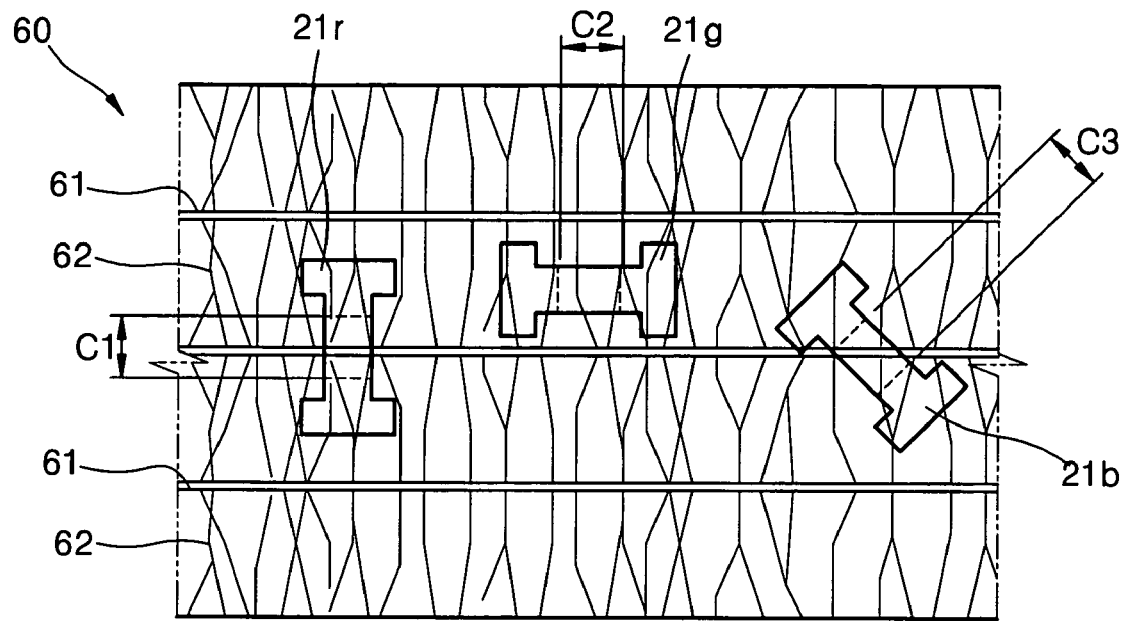
FIG. 5 is a plan view of the polycrystalline silicon thin film of FIG. 2 in which active layers are arranged in different directions according to an anisotropic crystal structure.

FIG. 5 is a plan view of the silicon thin film 60 of FIG. 2 in which a second semiconductor active layer 21r, a second semiconductor active layer 21g, and a second semiconductor active layer 21b are arranged in different directions with respect to the direction of the primary grain boundaries 61.

As shown in FIG. 5, the second semiconductor active layer 21r is disposed such that the current-flowing direction at a channel region C1 is approximately parallel to the side grain boundaries 62, that is, the direction of current-flow in the channel region C1 makes about 90 degrees with the primary grain boundaries 61. The second semiconductor active layer 21g, is disposed such that the direction of current-flow in a channel region C2 is perpendicular to the side grain boundaries 62, that is, the current-flowing direction at the channel region C2 makes about 0 degrees with the primary grain boundaries 61. The second semiconductor active layer 21B is disposed such that the direction of current-flow in a channel region C3 is inclined with respect to the primary grain boundaries 61.

The inclination angles of the second semiconductor active layers 21r, 21g, and 21b may vary depending on the type of an organic material used. After the luminance of each pixel and a current ratio for a white balance are calculated in advance, the inclination values of the second semiconductor active layers of red and blue sub-pixels are determined based on the inclination value of the second semiconductor active layer of a green sub-pixel.

The second semiconductor active layers 21r, 21g, and 21b of the second TFTs 20r, 20g, and 20b are arranged in different directions determined by the above method, thereby forming an organic EL display as shown in FIG. 1. In other words, although not shown in FIG. 1, similar to FIG. 5 the side grain boundaries 62 are formed vertically, and the primary grain boundaries 61 are formed horizontally. In the sub-pixels of the red pixel R, the second active layers 21r of the second TFTs 20r are all arranged in directions perpendicular to the primary grain boundaries 61, and accordingly have higher mobility. Hence, the largest current can be supplied to the organic EL element of the sub-pixels of the red pixel R although an identical driving voltage is applied to all of the sub-pixels of the red, green, and blue pixels R, G, and B. In the sub-pixels of the green pixel G, the second active layers 21g of the second TFTs 20g are all arranged in directions parallel to the primary grain boundaries 61, and accordingly, have small mobility. Hence, the smallest current can be supplied to the organic EL element of the sub-pixels of the green pixel G although a substantially identical driving voltage is applied to all of the sub-pixels of the red, green, and blue pixels R, G, and B. In the sub-pixels of the blue pixel B, the second active layers 21b of the second TFTs 20b are inclined with respect to the primary grain boundaries 61, and accordingly, they have a mobility between the mobility values for the R and G pixels and amount of current between in the R and G pixels. Hence, the R, G, and B pixels can achieve a white balance.

In the exemplary embodiment of the present invention of FIG. 1, similar to the second active layers 21r of the red pixel R, the first active layers 11r, 11g, and 11b of the first TFTs 10r, 10g, and 10b, which are switching units, are arranged parallel to the side grain boundaries 62 to make the first TFTs 10r, 10g, and 10b have higher mobility so as to improve the switching characteristics of the first TFTs 10r, 10g, and 10b. Although only the second active layers 21r, 21g, and 21b of the second TFTs 20r, 20g, and 20b are arranged in different directions for sub-pixels of different colors in FIG. 1, the first active layers 11r, 11g, and 11b of the first TFTs 10r, 10g, and 10b can also be arranged in different directions as the second active layers 21r, 21g, and 21b.

Each pixel of an organic EL display as described above has a structure shown in FIGS. 6 through 9.

Figure 6:
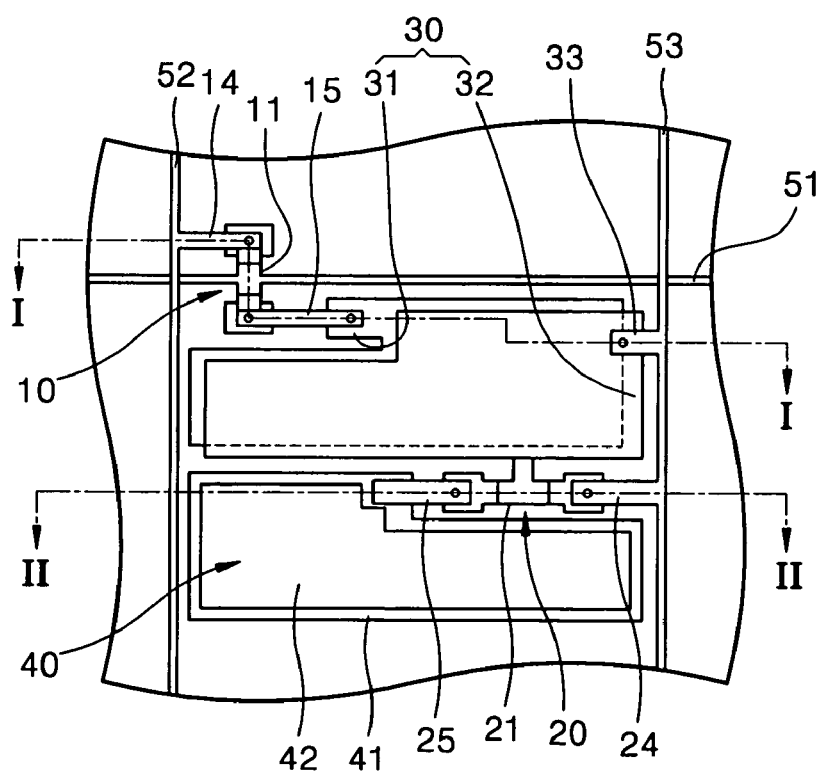
FIG. 6 is a partially magnified plan view of a unit pixel of FIG. 1.

FIG. 6 is a partially magnified plan view of a sub-pixel of the green pixel G among the sub-pixels of FIG. 1. The sub-pixel structure of FIG. 6 is not limited to the green pixel G but can be applied to other color pixels of the invention. Hence, the sub-pixel of FIG. 6 does not denote a specific sub-pixel but any unspecified sub-pixel to which the invention can be applied, and the reference numerals of FIG. 6 also indicate elements associated with any unspecified sub-pixel.

Figure 7:
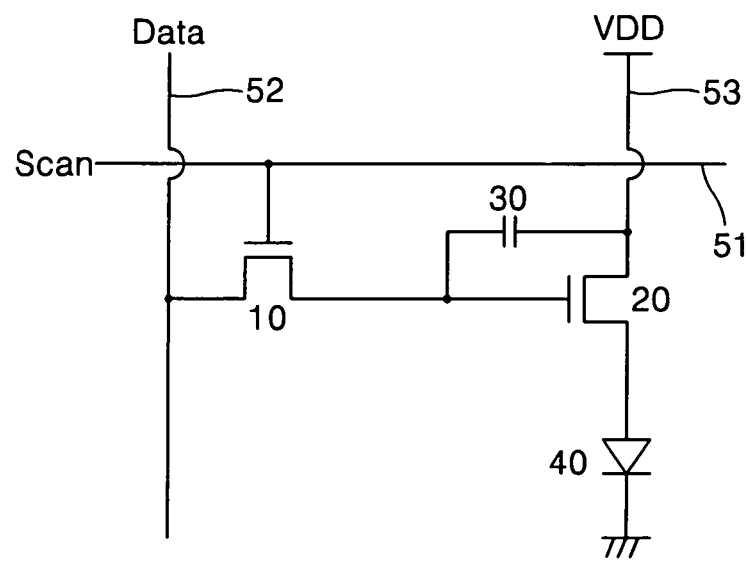
FIG. 7 is an equivalent circuit diagram of the unit pixel of FIG. 6.

FIG. 7 is an equivalent circuit diagram of an unspecified sub-pixel of FIG. 6. Referring to FIG. 7, each of the sub-pixels of an AM-type organic EL display is made up of a first TFT 10 for use as a switching unit, a second TFT 20 for use as a driving unit, a capacitor 30, and an organic EL element 40 (hereinafter, referred to as "EL element"). The number of TFTs and the number of capacitors are not limited by the circuit shown in FIG. 7. A greater number of TFTs and capacitors than the two TFTs and one capacitor can be included according to the design conditions.

The first TFT 10 is driven in response to a scan signal applied to a gate line 51 and transmits a data signal to a data line 52. The second TFT 20 determines the amount of current flowing into the EL element 40, using the data signal received through the first TFT 10, that is, a voltage difference Vgs between a gate and a source. The capacitor 30 stores the data signal received through the first TFT 10, for a period of one frame.

Figure 8:
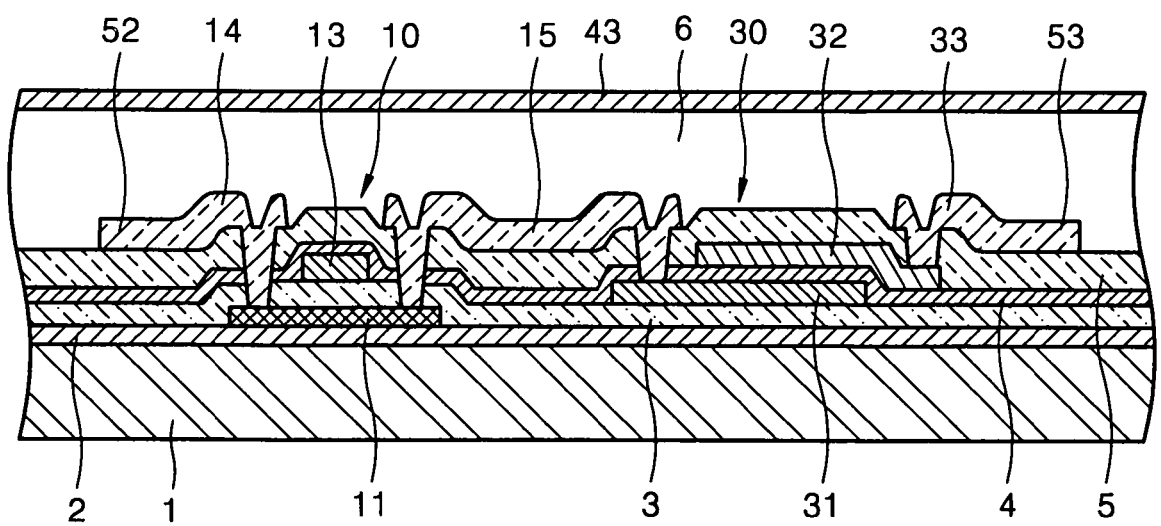
FIG. 8 is a cross-section taken along line I-I of FIG. 6.
Figure 9:
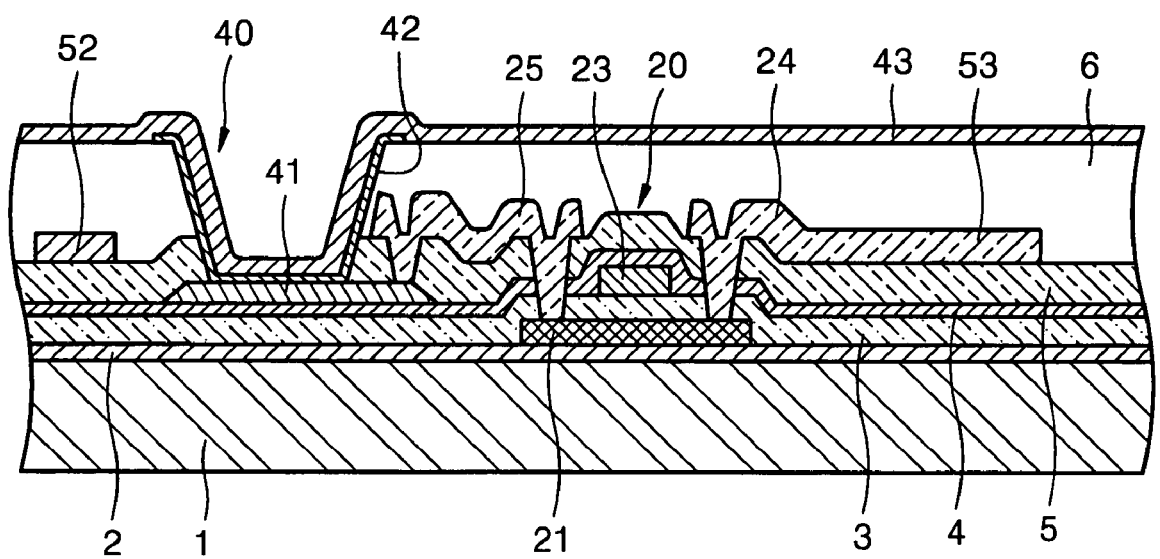
FIG. 9 is a cross-section taken along line II-II of FIG. 6.

An organic EL display having such a structure as shown in FIGS. 8 and 9 is formed to achieve the circuit of FIG. 7. The structure of the organic EL display will now be described in detail.

As can be seen from FIGS. 6, 8, and 9, a buffer layer 2 is formed on a glass insulating substrate 1, and the first and second TFTs 10 and 20, the capacitor 30, and the EL element 40 are installed over the buffer layer 2.

As shown in FIG. 8, the first TFT 10 is made up of a first active layer 11, a gate electrode 13, a source electrode 14, and a drain electrode 15. The gate electrode 13 is connected to the gate line 51 of FIG. 6 and receives a TFT on/off signal via the gate line 51 and outputs the same. The source electrode 14 is located above the gate electrode 13, connected to the data line 52, and supplies a data signal to the first active layer 11. The drain electrode 15 connects the first TFT 10 to the capacitor 30 to supply power to the capacitor 30. A gate insulating layer 3 is formed between the first active layer 11 and the gate electrode 13.

The charging capacitor 30 is located between the first and second TFTs 10 and 20 and stores the amount of driving voltage necessary to drive the second TFT 20, for a period of one frame. As can be seen from FIGS. 6 and 8, the capacitor 30 can be made up of first and second electrodes 31 and 32 and an inter-insulating layer 4. The first electrode 31 is connected to the drain electrode 15 of the first TFT 10. The second electrode 32 overlaps the first electrode 31 and is electrically connected to a driving line 53, which is a power applying line, via a power line electrode 33. The inter-insulating layer 4 is formed between the first and second electrodes 31 and 32 and is used as a dielectric. The structure of the charging capacitor 30 is not limited to the structure shown in FIG. 8. For example, a silicon thin film for the TFT 10 and a conductive layer of the gate electrode 13 can be used as the first and second electrodes 31 and 32, respectively, and the gate insulating layer 3 can be used as a dielectric layer. Various other methods can also be used.

As can be seen from FIGS. 6 and 9, the second TFT 20 is made up of a second active layer 21, a gate electrode 23, a source electrode 24, and a drain electrode 25. The gate electrode 23 is connected to the first electrode 31 of the capacitor 30 and receives a TFT on/off signal via the first electrode 31 and outputs the same. The source electrode 24 is located above the gate electrode 23, connected to the driving line 53, and supplies a reference common driving voltage to a second active layer 21. The drain electrode 25 connects the second TFT 20 to the EL element 40 to supply driving power to the EL element 40. The gate insulating layer 3 is formed between the second active layer 21 and the gate electrode 23. Depending on the color of sub-pixels, the direction of current-flow in the channel region of the second active layer 21 is arranged parallel to, perpendicular to, or aslant to the grain boundaries of the second active layer 21.

The EL element 40 displays predetermined image data by emitting R, G, and B light as current flows. As can be seen from FIGS. 6 and 9, the EL element 40 is made up of an anode 41, a cathode 43, and an organic EL film 42. The anode 41 is connected to the drain electrode 25 of the second TFT 20 and receives plus power from the drain electrode 25. The cathode electrode 43 covers the entire body of a pixel and supplies minus power to the pixel. The organic EL film 42 is located between the anode 42 and the cathode 43 and emits light. Reference numeral 5 denotes a $SiO_2$ insulative passivation film formed of $SiO_2$ or the like, and reference numeral 6 denotes an insulative planarization film formed of acryl or the like.

The layer structure of an organic EL display according to the present invention is not limited to the layer structure shown in FIGS. 6, 8, and 9, and other layer structures can be applied to an organic EL display according to the present invention.

The organic EL display having the above-described structure can be manufactured, for example, by the following method.

First, as shown in FIGS. 8 and 9, the buffer layer 2 is formed on the glass insulating substrate 1. The buffer layer 2 can be formed, for example, of SiO$_2$ to a thickness of about 3000 Å by PECVD, APCVD, LPCVD, ECR, or the like.

An amorphous silicon thin film is deposited on the buffer layer 2, for example, to a thickness of about 500 Å. The amorphous silicon thin film can be solidified into a polycrystalline silicon thin film using various methods. Preferably, the polycrystalline silicon thin film has an anisotropic crystal structure in which grain boundaries as shown in FIG. 2 extend lengthwise. In the exemplary embodiment of the present invention, as described above, the anisotropic crystal structure is formed by SLS. However, any solidification method that can obtain an anisotropic crystal structure can be used.

After the polycrystalline silicon thin film having an anisotropic crystal structure is formed, as can be seen from FIG. 1, the second active layers 21r, 21g, and 21b of the second TFTs 20r, 20g, and 20b in sub-pixels of different colors are arranged in a pattern to have different directions with respect to the direction of grain boundaries. At this time, the first active layers 11r, 11g, and 11b are also patterned, e.g. MILC.

Thereafter, the gate insulating layer 3 is formed of SiO2 on the patterned active layers 20r, 20g, 20b, 21r, 21g, ad 21b by PECVD, APCVD, LPCVD, ECR, or the like. Then, a conductive film is formed of MoW, Al/Cu, or the like and then patterned, thereby forming gate electrodes 13 and 23. The active layers 20r, 20g, 20b, 21r, 21g, ad 21b, the gate insulating layer 3, and the gate electrodes 13 and 23 can be patterned in various sequences and methods.

After the patterning of the active layers, the gate insulating layer, and the gate electrodes, the source and drain regions are doped with N- or P-type impurities.

Thereafter, as shown in FIGS. 8 and 9, the inter-insulating layer 4 and the passivation film 5 are formed, the source electrodes 14 and 24 and the drain electrodes 15 and 25 are connected to the active layers 11 and 21 via control holes, and the planarization film 6 is formed. It should be understood by one of ordinary skill in the art that this film structure can vary according to design conditions.

The EL element 40, which is connected to the second TFT 20, can be formed by various methods. First, the anodes 41 contacting the drain electrodes 25 of the second TFT 20 are formed of Indium Tin Oxide (ITO) in a pattern, and the organic EL film 42 is formed on the anodes 41. The organic EL film 42 can be either a monomer or polymer organic film. A monomer organic EL film can be formed by stacking a hole implementation layer, a hole transport layer, an organic EL layer, an electron transport layer, and an electron implementation layer in a simple or complex structure. Various organic materials can be used, including Copper phthalocyanine (CuPc), N,N'-Di (naphthalene-1-yl)-N,N'-diphenylbenzidine (NPB), and tris-8-hydroxyquinoline aluminum (Alq$_3$). These monomer organic EL films may be formed, for example, by vacuum deposition.

A polymer organic EL film can be made up of a hole transport layer (HTL) and a light emitting layer (EML). Here, the hole transport layer can be formed of PEDOT, and the light emitting layer can be formed of a polymer organic material, such as, poly-phenylenevinylene (PPV)-containing material and polyfluorence-containing material, by screen printing or Inkjet printing.

After the formation of the organic EL film 42, the cathode 43 can be formed by depositing Al/Ca, for example, on the entire surface of the organic EL film 42. The cathode 43 may cover the entire surface or it may be patterned. The cathode 43 is covered by a glass or metal cap.

The invention is not limited to the above-described organic EL display but can be applied to any displays capable of using TFTs, such as, liquid crystal displays or inorganic EL displays.

A flat panel display according to the invention as described above is capable of achieving a white balance with active layer of the same size for the R, G and B sub-pixels and/or with the application of a same driving voltage to the R, G and B sub-pixels.

Also, because an appropriate amount of current is supplied to individual sub-pixels, a proper level of luminance can be obtained, and degradation of the life span of the flat panel display can be prevented.

In addition, a reduction of an aperture of the flat panel display can be prevented and the reliability thereof can be improved, by controlling only the amount of current flowing in an organic EL element without increasing the area of each pixel occupied by a driving TFT.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A flat panel display comprising:
    a plurality of pixels, each pixel including a plurality of sub-pixels, and each sub-pixel comprising a self-luminescent element; and
    driving thin film transistors, wherein each thin film transistor has a semiconductor active layer with a channel region electrically connected to each of the self-luminescent elements to supply current to each of the self-luminescent elements, wherein the channel regions of the semiconductor active layer in at least two sub-pixels are arranged in different directions.

2. The flat panel display of claim 1, wherein the sub-pixels have different colors.

3. The flat panel display of claim 2, wherein the channel regions in the sub-pixels of different colors are arranged in different directions.

4. The flat panel display of claim 1, wherein the different directions of the channel regions are determined by an amount of current flowing in the self-luminescent element of the sub-pixels of different colors when a substantially identical driving voltage is applied to the sub-pixels of different colors.

5. The flat panel display of claim 1, wherein the different directions of the channel regions are determined by different mobility values of the channel regions of the driving thin film transistors of the sub-pixels of different colors.

6. The flat panel display of claim 1, wherein the semiconductor active layers are formed of polycrystalline silicon.

7. The flat panel display of claim 6, wherein the polycrystalline silicon has anisotropic grains.

8. The flat panel display of claim 6, wherein the different directions of the channel regions are determined by directions of grain boundaries of the polycrystalline silicon of the channel regions.

9. The flat panel display of claim 8, wherein the different directions of the channel regions are determined so that angles made by a direction of current flow in the channel regions of the sub-pixels of different colors and the grain boundaries of the polycrystalline silicon of the channel regions are proportional to an amount of current flowing in the sub-pixels of different colors when an identical driving voltage is applied to the sub-pixels of different colors.

10. The flat panel display of claim 9, wherein the different directions of the channel regions are determined so that the angles made by the direction of current flow in the channel regions of the sub-pixels of different colors and the grain boundaries of the polycrystalline silicon of the channel regions are proportional to mobility values of the channel regions.

11. The flat panel display of claim 6, wherein the polycrystalline silicon is formed using a solidification method involving a laser.

12. A flat panel display comprising:
a plurality of pixels, each pixel including a red sub-pixel, a green sub-pixel and a blue sub-pixel, each sub-pixel comprising a self-luminescent element; and
driving thin film transistors, wherein each thin film transistor has a semiconductor active layer having a channel region connected to the self-luminescent elements of the sub-pixel in order to supply current to the self-luminescent element, wherein the channel regions of the semiconductor active layers in at least two different colored sub-pixels are arranged in different directions.

13. The flat panel display of claim 12, wherein the different directions of the channel regions are determined by an amount of current flowing in the self-luminescent elements of the in at least two different colored sub-pixels when a substantially identical driving voltage is applied to the said sub-pixel of different colors.

14. The flat panel display of claim 13, wherein the different directions of the channel regions are determined so that the amount of current in the self-luminescent elements of the red sub-pixels is greater than the amount of current in the self-luminescent element of the green sub-pixels.

15. The flat panel display of claim 12, wherein the different directions of the channel regions are determined so that a current of a smallest amount flows in the self-luminescent elements of the green sub-pixels.

16. The flat panel display of claim 12, wherein the different directions of the channel regions are determined by mobility values of the channel regions of the driving thin film transistors of the red sub-pixels, the blue sub-pixels and the green sub-pixels.

17. The flat panel display of claim 16, wherein the different directions of the channel regions are determined so that the channel region of the semiconductor active layer of the driving thin film transistors of a green sub-pixel has the smallest mobility value.

18. The flat panel display of claim 16, wherein the different directions of the channel regions are determined so that the mobility values of the channel regions of the driving thin film transistors decrease in the sequence of red, blue, and then green sub-pixels.

19. The flat panel display of claim 12, wherein the semiconductor active layers are formed of polycrystalline silicon.

20. The flat panel display of claim 19, wherein the polycrystalline silicon has anisotropic grains.

21. The flat panel display of claim 19, wherein the different directions of the channel regions are determined by the directions of grain boundaries of the polycrystalline silicon of the channel regions.

22. The flat panel display of claim 21, wherein the different directions of the channel regions are determined so that an angle made by a direction of current flow in the channel region of a green sub-pixel and a grain boundary of the polycrystalline silicon of the channel region of the green sub-pixel is greater than angles made by a direction of current flow in the channel regions of the red and blue sub-pixels with grain boundaries of the polycrystalline silicon of the channel regions of the red and blue sub-pixels.

23. The flat panel display of claim 21, wherein the different directions of the channel regions are determined so that an angle made by a direction of current flow in the channel region of a red sub-pixel and a grain boundary of the polycrystalline silicon of the channel region of the red sub-pixel is smaller than angles made by a direction of current flow in the channel regions of the green and blue sub-pixels with grain boundaries of the polycrystalline silicon of the channel regions of the green and blue sub-pixels.

24. The flat panel display of claim 21, wherein the different directions of the channel regions are determined so that an angle made by the channel region of a sub-pixel and a grain boundary of the polycrystalline silicon of the channel region of the driving thin film transistor of the sub-pixel decreases in sequence of green, blue, and then red sub-pixels.

25. The flat panel display of claim 19, wherein the polycrystalline silicon has primary grain boundaries parallel to one another and side grain boundaries each approximately perpendicular to the primary grain boundaries and located between adjacent primary grain boundaries.

26. The flat panel display of claim 25, wherein the different directions of the channel regions are determined with respect to the direction of the primary grain boundaries of the polycrystalline silicon of the channel regions.

27. The flat panel display of claim 26, wherein the different directions of the channel regions are determined so that an angle made by the direction of current flow in the channel region of a green sub-pixel and a primary grain boundary of the polycrystalline silicon of the channel region of the green sub-pixel is smaller than angles made by the current-flowing direction at the channel regions of the red and blue sub-pixels with the primary grain boundaries of the polycrystalline silicon of the channel regions of the red and blue sub-pixels.

28. The flat panel display of claim 26, wherein the different directions of the channel regions are determined so that an angle made by the direction of current flow in the channel region of a red sub-pixel and a primary grain boundary of the polycrystalline silicon of the channel region of the red sub-pixel is greater than angles made by the direction of current flow in the channel regions of the green and blue sub-pixels with grain boundaries of the polycrystalline silicon of the channel regions of the green and blue sub-pixels.

29. The flat panel display of claim 26, wherein the different directions of the channel regions are determined so that an angle made by the direction of current flow in the channel region of a sub-pixel and a primary grain boundary of the polycrystalline silicon of the channel region of the sub-pixel increases in sequence of green, blue, and then red sub-pixels.

30. The flat panel display of claim 26, wherein the direction of current flow in the channel region of each of the green sub-pixels is parallel to a primary grain boundary of the polycrystalline silicon of the channel region.

31. The flat panel display of claim 26, wherein the direction of current flow in the channel region of each of the red sub-pixels is perpendicular to a primary grain boundary of the polycrystalline silicon of the channel region.

32. The flat panel display of claim 19, wherein the polycrystalline silicon is formed using a solidification method using laser.

* * * * *